United States Patent
Yang et al.

(10) Patent No.: US 11,378,098 B2
(45) Date of Patent: Jul. 5, 2022

(54) TELESCOPIC FAN CAGE AND APPARATUS CASE THEREWITH

(71) Applicant: Wistron Corporation, New Taipei (TW)

(72) Inventors: Jian Bang Yang, New Taipei (TW); Zhaoping Fu, New Taipei (TW)

(73) Assignee: Wistron Corporation, New Taipei (TW)

(*) Notice: Subject to any disclaimer, the term of this patent is extended or adjusted under 35 U.S.C. 154(b) by 316 days.

(21) Appl. No.: 16/739,125

(22) Filed: Jan. 10, 2020

(65) Prior Publication Data

US 2021/0131450 A1  May 6, 2021

(30) Foreign Application Priority Data

Nov. 5, 2019 (CN) .......................... 201911071086.6

(51) Int. Cl.

| | |
|---|---|
| *G06F 1/16* | (2006.01) |
| *H05K 5/00* | (2006.01) |
| *H05K 7/00* | (2006.01) |
| *F04D 29/64* | (2006.01) |
| *H01L 23/40* | (2006.01) |
| *H05K 7/14* | (2006.01) |
| *F04D 19/00* | (2006.01) |

(Continued)

(52) U.S. Cl.
CPC ......... *F04D 29/646* (2013.01); *F04D 19/002* (2013.01); *F04D 29/601* (2013.01); *G06F 1/183* (2013.01); *H01L 23/40* (2013.01); *H05K 5/0208* (2013.01); *H05K 5/0221* (2013.01); *H05K 7/14* (2013.01); *H05K 7/1415* (2013.01); *H05K 7/20172* (2013.01)

(58) Field of Classification Search
CPC .......... H05K 7/20172; H05K 7/20136; H05K 7/20209; H05K 7/20709–20754; H05K 7/20536; H05K 7/20618; H05K 7/20972; H05K 7/14; H05K 7/1415; H01L 23/40
See application file for complete search history.

(56) References Cited

U.S. PATENT DOCUMENTS

| | | | | |
|---|---|---|---|---|
| 6,940,716 B1* | 9/2005 | Korinsky | .................. | G06F 1/20 |
| | | | | 165/121 |
| 7,165,604 B2* | 1/2007 | Huang | ................ | H01L 23/4093 |
| | | | | 165/121 |

(Continued)

FOREIGN PATENT DOCUMENTS

CN 102207759 A 10/2011

*Primary Examiner* — Anthony M Haughton
(74) *Attorney, Agent, or Firm* — Winston Hsu (57) ABSTRACT

A telescopic fan cage includes a main frame and a side frame which are slidably connected with each other to form a fan installation space. The side frame is capable of sliding toward the main frame to shrink the fan installation space, or sliding away relative to the main frame to expand the fan installation space. An apparatus case includes a casing and the telescopic fan cage. The telescopic fan cage is detachably disposed in the casing. Therein, the side frame is capable of sliding toward the main frame to shrink the fan installation space, so that the telescopic fan cage is at a transit state for moving in or out the casing; the side frame is capable of sliding away relative to the main frame to expand the fan installation space, so that the telescopic fan cage is at an installation state for being fixed in the casing.

20 Claims, 10 Drawing Sheets

(51) Int. Cl.
*G06F 1/18* (2006.01)
*F04D 29/60* (2006.01)
*H05K 7/20* (2006.01)
*H05K 5/02* (2006.01)

(56) References Cited

U.S. PATENT DOCUMENTS

| | | | |
|---|---|---|---|
| 9,596,790 B2* | 3/2017 | Ambriz | H05K 7/20736 |
| 9,603,289 B1* | 3/2017 | Shearman | H05K 7/1488 |
| 10,485,136 B2* | 11/2019 | Gopalakrishna | H05K 7/20172 |
| 2009/0021912 A1* | 1/2009 | Yin | G06F 1/20 |
| | | | 361/695 |
| 2012/0085883 A1* | 4/2012 | Lu | H05K 7/20172 |
| | | | 248/672 |
| 2018/0228057 A1* | 8/2018 | Beall | G11B 33/142 |
| 2018/0260352 A1* | 9/2018 | Long | G06F 1/206 |
| 2019/0132996 A1* | 5/2019 | Skoglund | H05K 5/0213 |

* cited by examiner

TELESCOPIC FAN CAGE AND APPARATUS CASE THEREWITH

BACKGROUND OF THE INVENTION

1. Field of the Invention

The present invention relates to an apparatus case having a fan cage, and more particularly to a telescopic fan cage and an apparatus case therewith.

2. Description of the Prior Art

Conventional apparatus cases (e.g. for servers) are usually equipped with fans. A cage used for fixing and supporting fans is usually designed to be separable from the casing of the apparatus case, which is conducive to modularization. In principle, the casing needs to provide a passage sufficient for the cage to pass through, so that the cage will not structurally interfere with the casing during an installation of the cage. In general, the cage is fixed to two opposite side walls of the casing, so the structure design of the side wall is limited and the industry design of the apparatus case is also influenced indirectly. For example, the edge of the side wall is not suitable to form an inwardly-bent structure (e.g. fillet, which will limit the width of the passage). Furthermore, after the cage is fixed in the casing, the cage does not necessarily occupy the whole passage. Even if some space of the passage is not occupied by the cage (e.g. the space above the fixed cage), it is unable to fix a structure therein, which will influences the space usage of the apparatus case. In addition, the structure used for fixing the cage to the casing usually needs to be manipulated by hands of a user (with a tool) so that the cage can be fixed to or detached from the casing. The casing needs to reserve space for convenience of the above manipulation, which limits the structure design of the casing and also influences the industry design of the apparatus case.

SUMMARY OF THE INVENTION

An objective of the invention is to provide a telescopic fan cage, which uses its telescopic property in structure to easily avoid structural interference with other structures during an installation.

A telescopic fan cage according to the invention includes a main frame and a side frame. The side frame and the main frame are slidably connected with each other to form a fan installation space. The side frame is operable to slide toward the main frame to shrink the fan installation space; the side frame is also operable to slide away relative to the main frame to expand the fan installation space. Thereby, the telescopic fan cage increases the flexibility of installation and movement by use of its telescopic property in structure.

Another objective of the invention is to provide an apparatus case, which includes the above telescopic fan cage and uses its telescopic property in structure to easily avoid structural interference with other structures of the apparatus case during an installation of the telescopic fan cage.

An apparatus case according to the invention includes a casing and a telescopic fan cage. The telescopic fan cage is detachably disposed in the casing. The telescopic fan cage includes a main frame and a side frame. The side frame and the main frame are slidably connected with each other to form a fan installation space. Therein, the first side frame is operable to slide toward the main frame to shrink the fan installation space, so that the telescopic fan cage is at a transit state for being moved in or out the casing; the first side frame is operable to slide away relative to the main frame to expand the fan installation space, so that the telescopic fan cage is at an installation state for being fixed to the casing.

Compared with the prior art, in the telescopic fan cage and the apparatus case therewith according to the invention, the telescopic fan cage has the telescopic property in structure, so during the process of installing the telescopic fan cage into the casing or taking the telescopic fan cage out of the casing, it is practicable to implement the process by a single hand without structural interference between the telescopic fan cage and other structures of the apparatus case, which can increase the flexibility of industry design of the apparatus case and the usage of the interior space of the apparatus case.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
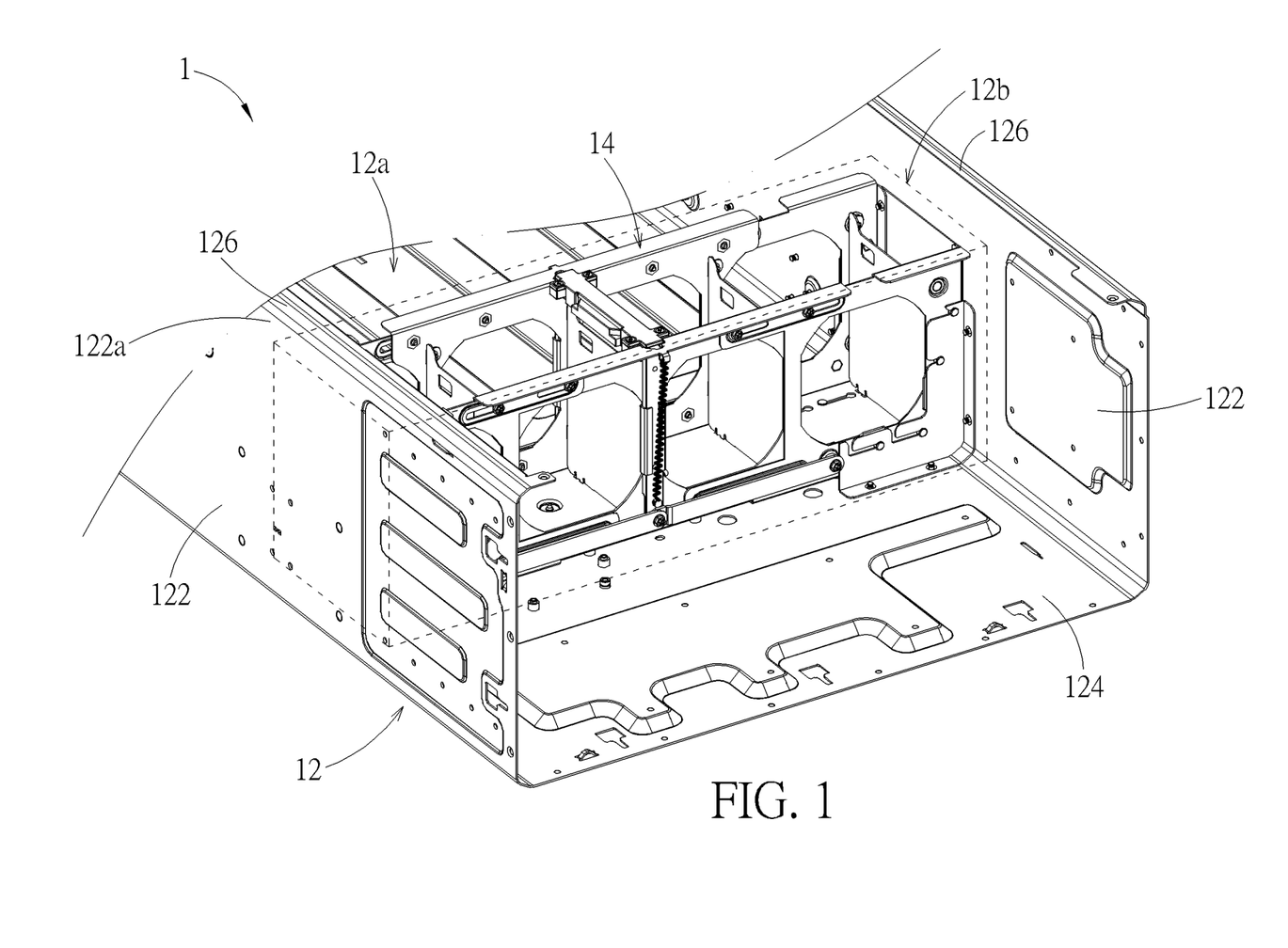
FIG. 1 is a schematic diagram illustrating an apparatus case according to an embodiment.
Figure 2:
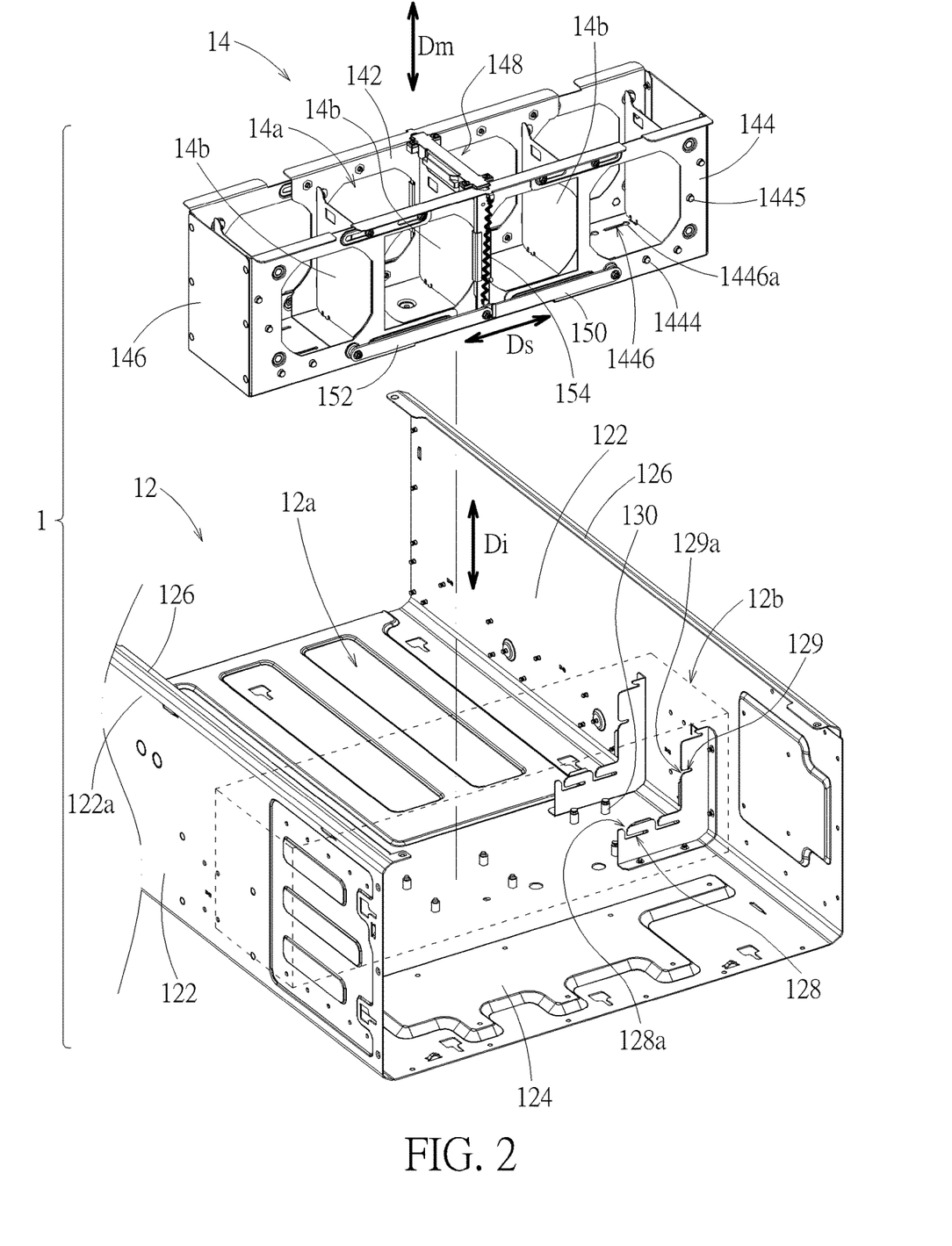
FIG. 2 is a partially exploded view of the apparatus case in FIG. 1.

Please refer to FIG. 1 and FIG. 2. An apparatus case 1 according to an embodiment includes a casing 12 and a telescopic fan cage 14. The telescopic fan cage 14 is detachably disposed in the casing 12. The telescopic fan cage 14 includes a main frame 142, a first side frame 144, and a second side frame 146. The first side frame 144 and the second side frame 146 are respectively slidably connected to the main frame 142, so that the telescopic fan cage 14 as a whole has a telescopic property in structure. Therein, the main frame 142, the first side frame 144, and the second side frame 146 together form a fan installation space 14a. The first side frame 144 and the second side frame 146 can slide toward the main frame 142 to shrink the fan installation space 14a and also can slide away relative to the main frame 142 to expand the fan installation space 14a. Therefore, during the process of installing the telescopic fan cage 14 into the casing 12 or moving the telescopic fan cage 14 out of the casing 12, it is practical to avoid structural interference of the telescopic fan cage 14 with the casing 12 (or other components disposed therein) by the telescopic property in structure of the telescopic fan cage 14. From another aspect, the casing 12 can provide a passage, of which size is smaller than that of the telescopic fan cage 14 that has been expanded completely. The passage still can allow the telescopic fan cage 14 to be installed into the casing 12 or detached from the casing 12. Furthermore, in practice, the apparatus case 1 can be applied but not limited to computer hosts and servers. In addition, in the embodiment, the fan installation space 14a is divided into several sub-spaces by several division plates 14b. Each sub-space can allow a fan or other device to be installed therein; however, it is not limited thereto in practice.

Figure 3:
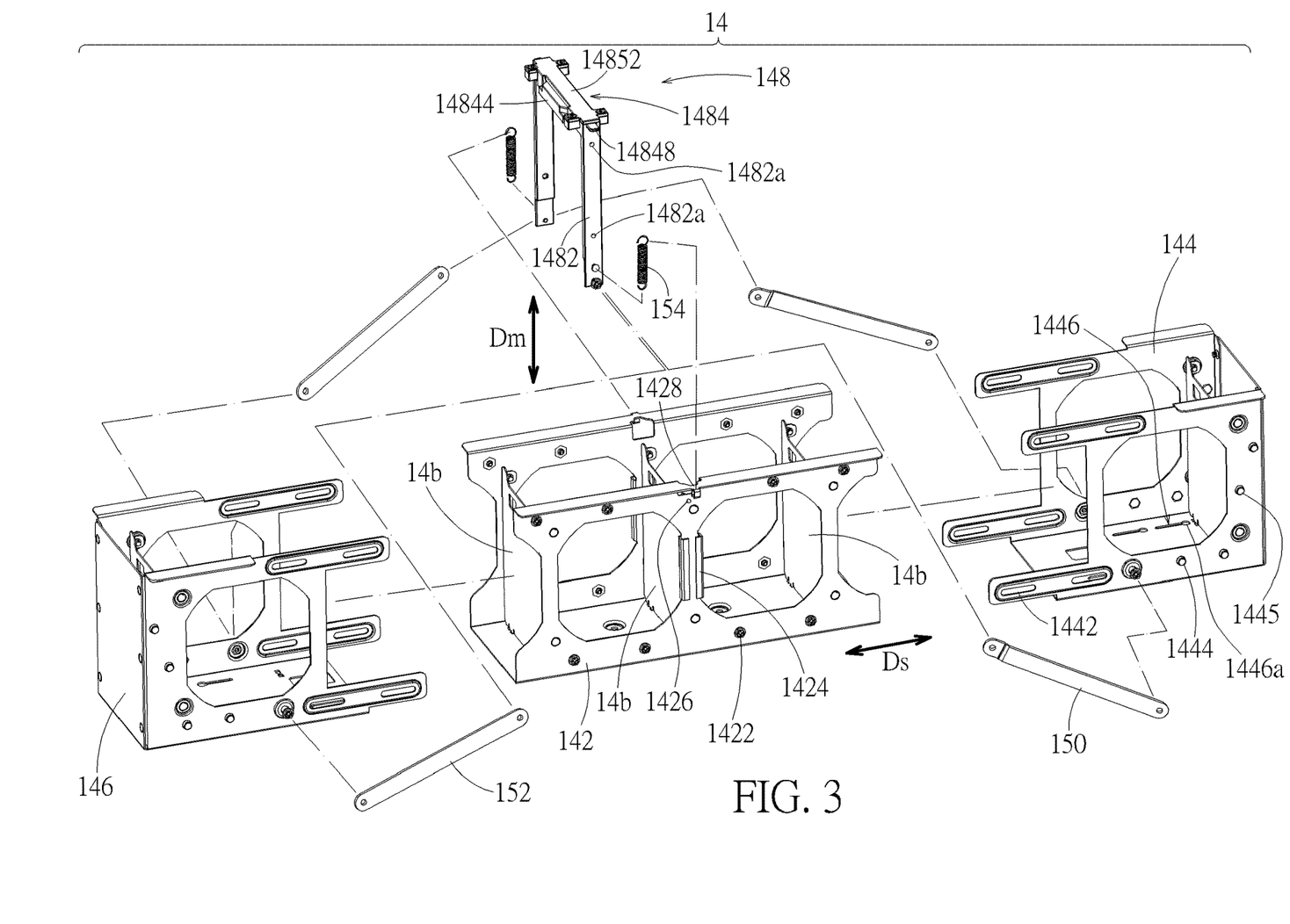
FIG. 3 is a partially exploded view of a telescopic fan cage of the apparatus case in FIG. 1.

Please refer to FIG. 2 and FIG. 3. In the embodiment, the first side frame 144 includes several sliding slots 1442. The main frame 142 includes a sliding block 1422 for each sliding slot 1442. The first side frame 144 and the main frame 142 are slidably connected with each other by slidably disposing the sliding blocks 1422 in the corresponding sliding slots 1442. Therein, the sliding slot 1442 extends parallel to a sliding direction Ds (indicated by a double-headed arrow in FIG. 2 and FIG. 3), so that the first side frame 144 is slidably connected to the main frame 142 along the sliding direction Ds; i.e. the first side frame 144 can slide relative to the main frame 142 parallel to the sliding direction Ds. The sliding block 1422 is realized by a post; however, it is not limited thereto in practice. For example, a rectangle block can be taken as the sliding block 1422. Furthermore, in practice, the sliding slot 1442 and the sliding block 1422 can be exchanged to be disposed on the main frame 142 and the first side frame 144 respectively. Such structural configuration still can perform the sliding connection of the first side frame 144 and the main frame 142 along the sliding direction Ds. Furthermore, in practice, each of the first side frame 144 and the main frame 142 can includes the sliding slot and the sliding block at the same time. Such structural configuration also can perform the sliding connection of the first side frame 144 and the main frame 142. Furthermore, in practice, the first side frame 144 and the main frame 142 also can be slidably connected through other slidably connecting mechanism, e.g. slides, dovetail slots, long slots with guiding posts inserted therein, and so on.

In the embodiment, the telescopic fan cage 14 further includes a manipulation part 148 and a first linkage part 150. The manipulation part 148 is slidably disposed on the main frame 142. The first linkage part 150 is connected to the manipulation part 148 and the first side frame 144. The manipulation part 148 can drive the first side frame 144 to move through the first linkage part 150. Thereby, the manipulation part 148 is convenient for a user to manipulate so as to move the first side frame 144 relative to the main frame 142. Therein, in the embodiment, the manipulation part 148 includes two sliding portions 1482 and a handle portion 1484 connecting the two sliding portions 1482. The main frame 142 includes a sliding slot 1424 for each sliding portion 1482. The sliding portions 1482 are slidably disposed in the corresponding sliding slots 1424, so that the manipulation part 148 is slidably connected to the main frame 142 through the two sliding portions 1482. In the embodiment, the sliding slot 1424 extends parallel to a manipulation direction Dm (indicated by a double-headed arrow in FIG. 2 and FIG. 3). The manipulation part 148 is operable (e.g. the user uses his hand to grip the handle portion 1484) to slide parallel to the manipulation direction Dm toward the main frame 142 or away relative to the main frame 142, so as to drive the first side frame 144 through the first linkage part 150 to slide parallel to the sliding direction Ds. Therein, the manipulation direction Dm is perpendicular to the sliding direction Ds; however, it is not limited thereto in practice.

Furthermore, in the embodiment, the first linkage part 150 is a link bar which is pivotally connected to the manipulation part 148 (or the sliding portion 1482 thereof) and the first side frame 144 for achieving the linkage between the manipulation part 148 and the first side frame 144; however, it is not limited thereto in practice. For example, the first linkage part 150 is realized by a flexible part (e.g. but not limited to a metal flexible tube, of which two ends are fixed to the sliding portion 1482 and the first side frame 144 respectively; further, based on an actual case, the main frame 142 can include a channel for accommodating the main portion of the metal flexible tube and constraining the movement thereof), which also can achieve the linkage between the manipulation part 148 and the first side frame 144. For another example, the first linkage part 150 is realized by two racks (fixed on the sliding portion 1482 and the first side frame 144 respectively) and a gear that is pivotally connected to the main frame 142 and meshes with the two racks, which also can convert motion between the manipulation part 148 and the first side frame 144. Furthermore, in the embodiment, the manipulation part 148 as a whole shows an n-shaped structure, which is conducive to smoothly sliding of the manipulation part 148 relative to the main frame 142 and is also conducive to the balance of the telescopic fan cage 14 that is carried by the user.

In the embodiment, the telescopic fan cage 14 further includes a second linkage part 152. The second linkage part 152 is connected to the manipulation part 148 and the second side frame 146. The manipulation part 148 can drive the second side frame 146 to move through the second linkage part 152. For simplification of description, the second side frame 146 and the first side frame 144 are structurally symmetrical and are slidably connected to opposite sides of the main frame 142. The second linkage part 152 and the first linkage part 150 are also structurally symmetrical. Hence, for other descriptions about the second side frame 146 and the second linkage part 152, please refer to the relevant descriptions of the first side frame 144 and the first linkage part 150 and variants thereof (including structure relationship with the main frame 142), which will not be described in addition. However, in practice, the telescopic fan cage 14 is not limited to be structurally symmetrical. For example, the second side frame 146 is modified to be slidably connected to the main frame 142 in another sliding direction (not parallel to the sliding direction Ds). For another example, the second side frame 146 is not linking-up to the manipulation part 148 (therein, the second linkage part 152 can be omitted).

Figure 4:
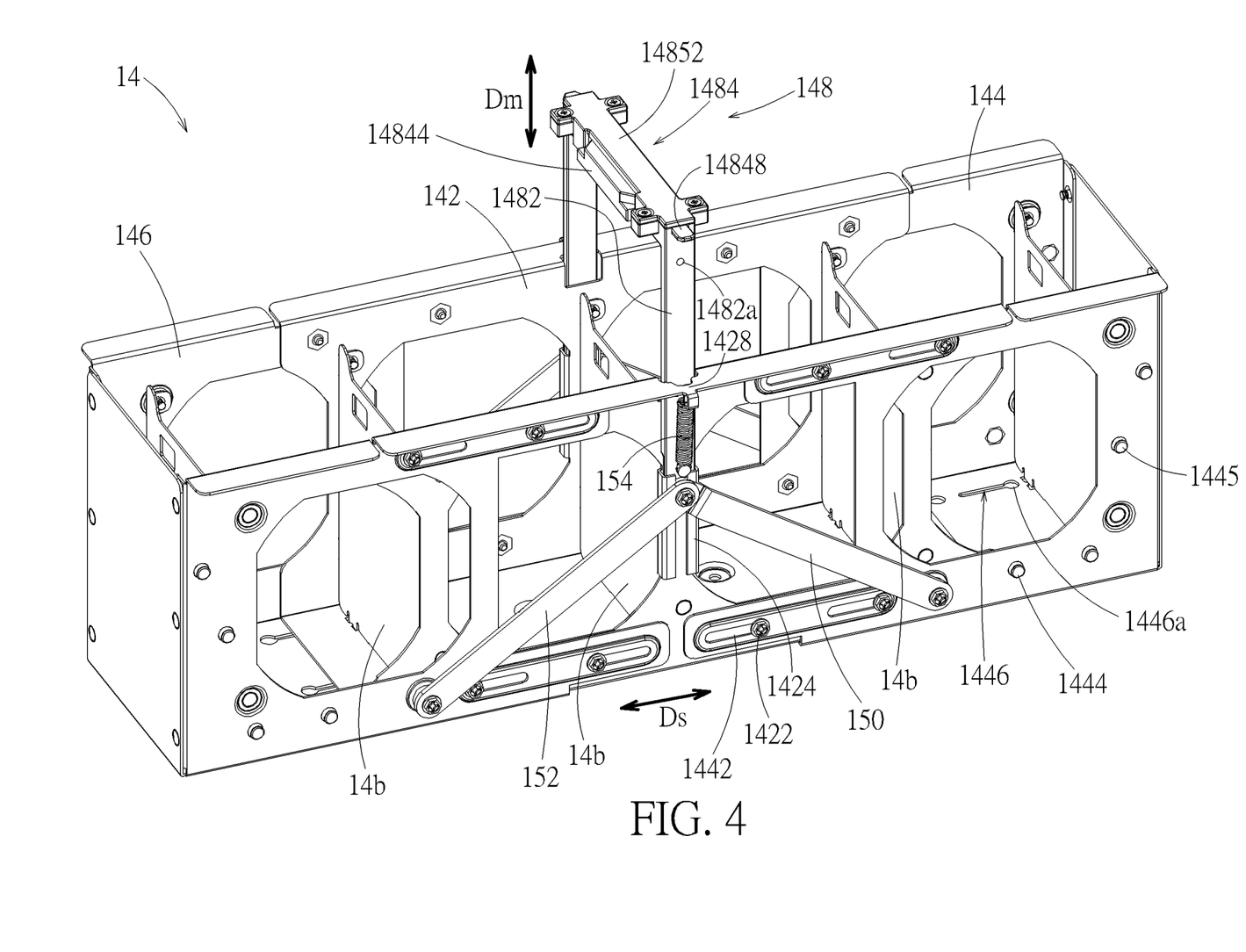
FIG. 4 is a schematic diagram illustrating the telescopic fan cage of the apparatus case in FIG. 1 when at a transit state.

In the embodiment, the manipulation part 148 can drive the first side frame 144 and the second side frame 146 to move. Therefore, the manipulation part 148 can be manipulated to slide away relative to the main frame 142 parallel to the manipulation direction Dm to drive the first side frame 144 and the second side frame 146 through the first linkage part 150 and the second linkage part 152 respectively to slide toward the main frame 142 parallel to the sliding direction Ds to shrink the fan installation space 14a, so that the telescopic fan cage 14 is at a transit state (as shown by FIG. 4) for convenience of moving the telescopic fan cage 14 in or out of the casing 12. At the moment, the first side frame 144 and the second side frame 146 are respectively located at a contraction position. When the telescopic fan cage 14 is at the transit state and is moved in the casing 12, the manipulation part 148 can be manipulated to slide toward the main frame 142 parallel to the manipulation direction Dm to drive the first side frame 144 and the second side frame 146 through the first linkage part 150 and the second linkage part 152 respectively to slide away relative to the main frame 142 parallel to the sliding direction Ds to expand the fan installation space 14a, so that the telescopic fan cage 14 is at an installation state (as shown by FIG. 1) for being fixed to the casing 12. At the moment, the first side frame 144 and the second side frame 146 are respectively located at an expansion position.

Figure 5:
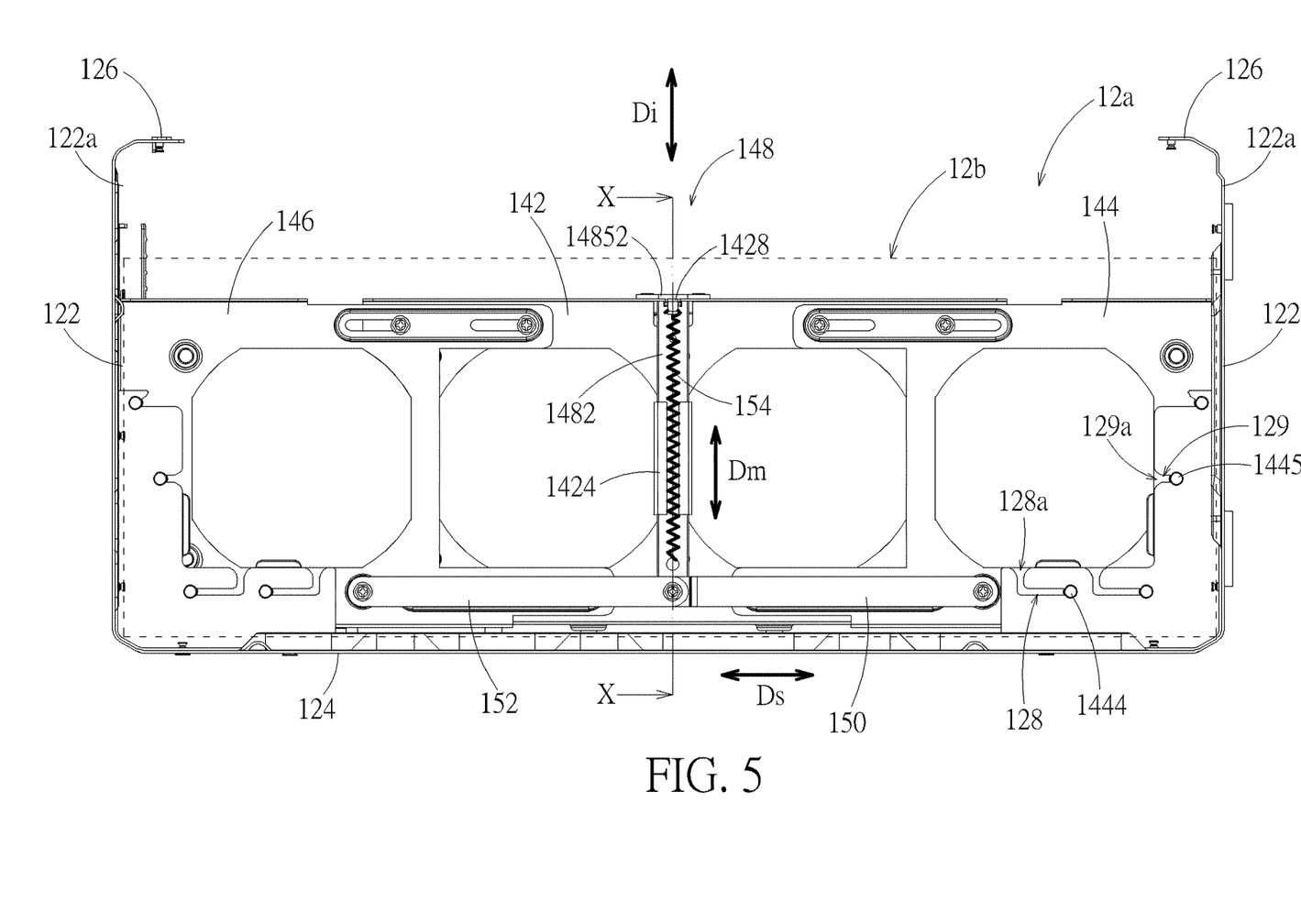
FIG. 5 is a front view of the apparatus case in FIG. 1.

Please also refer to FIG. 5. In the embodiment, the casing 12 includes two opposite side walls 122 and a bottom plate 124 connected to and between the side walls 122. The casing 12 forms an accommodating space 12a. The accommodating space 12a is used for accommodating the telescopic fan cage 14 and other components (e.g. other structures in the casing 12 and other electronic components, which are not shown in the figures). The accommodating space 12a includes a cage accommodating space 12b (of which the extent in the accommodating space 12a is indicated by dashed lines in FIG. 1, FIG. 2 and FIG. 5) formed between the side walls 122. The telescopic fan cage 14 is moved in or out of the cage accommodating space 12b along an installation direction Di (indicated by a double-head arrow in FIG. 2 and FIG. 5). In the embodiment, the casing 12 further includes a structure 126 on a fringe portion 122a of each side wall 122. Therein, in structural logic, the structure 126 is equivalent to a fillet structure. The structures 126 bend from the fringe portions 122a toward the interior of the accommodating space 12a (or bend toward each other) and extend. In practice, the structure 126 also can be other functional or decorative structure, for example, used for engaging with other structure or expressing appearance.

During the installation of the telescopic fan cage 14, the manipulation part 148 is pulled relative to the main frame 142 to drive the first side frame 144 and the second side frame 146 to move toward the main frame 142, until the telescopic fan cage 14 is at the transit state (as shown by FIG. 4). Then, the telescopic fan cage 14 is moved in the cage accommodating space 12b along the installation direction Di. Afterward, the manipulation part 148 is pushed relative to the main frame 142 to drive the first side frame 144 and the second side frame 146 to move away relative to the main frame 142, until the telescopic fan cage 14 is at the installation state, for fixing the telescopic fan cage 14 in the casing 12, as shown by FIG. 1.

In the embodiment, although the structure 126 is located above the cage accommodating space 12b in the installation direction Di, the length of the telescopic fan cage 14 in the sliding direction Ds has been shorten when the telescopic fan cage 14 is at the transit state, so that the telescopic fan cage 14 still can easily pass by the two structures 126 to get in or out the cage accommodating space 12b without structural interference with the two structures 126. Therefore, in practice, it is practicable to dispose other components in the portion of the accommodating space 12a above the cage accommodating space 12b (e.g. a cable arrangement bracket is protrusively disposed on the inner side of the side wall 122 toward the accommodating space 12a), as long as the space above the cage accommodating space 12b remains sufficient for the telescopic fan cage 14 at the transit state to pass through parallel to the installation direction Di. From another aspect, because the telescopic fan cage 14 has the telescopic property in structure, in the detachment and installation of the telescopic fan cage 14, the required passage provided by the casing 12 is smaller in size than that provided by the casing of conventional apparatus cases. Therefore, the structure design of the casing 12 of the apparatus case 1 according to the invention is more flexible and can utilize the accommodating space 12a of the casing 12 more efficiently. In addition, in practice, in the apparatus case 1, panels (not shown in the figures) can be disposed at the front and rear sides of the casing 12, and a cover (not shown in the figures) can be detachably disposed on the top of the casing 12, so as to substantially close the accommodating space 12a.

Furthermore, as shown by FIG. 2, in the embodiment, the first side frame 144 includes several guiding posts 1444 and 1445 and several guiding slots 1446. The casing 12 includes several guiding slots 128 and 129 and several guiding posts 130 correspondingly. The guiding slots 1446, 128 and 129 extend parallel to the sliding direction Ds. The guiding slots 1446 are formed on the bottom of the first side frame 144. The whole profile of the guiding slot 1446 shows a lock hole and has an opening 1446a. The whole profile of the guiding slot 128 shows an L shape and has an opening 128a. The opening 128a is oriented vertically upward (parallel to the installation direction Di). The guiding slot 129 is horizontally disposed and has an opening 129a. The opening 129a is oriented horizontally (parallel to the sliding direction Ds). The guiding posts 1444, 1445 and 130 are realized by T-shaped posts. After the telescopic fan cage 14 at the transit state is placed in the casing 12 in the installation direction Di (e.g. the user carries the handle portion 1484 by hand to place the telescopic fan cage 14 in the casing 12), the guiding post 1444 enters the corresponding guiding slot 128 from the opening 128a, the guiding post 130 enters the corresponding guiding slot 1446 from the opening 1446a, and the guiding post 1445 is aligned with the corresponding opening 129a. Afterward, during the process of pressing down the manipulation part 148 (i.e. moving toward the main frame 142) to drive the first side frame 144 (and the second side frame 146) to slide away relative to the main frame 142, the guiding posts 1444 and 130 slides in the guiding slots 128 and 1446 respectively, and the guiding post 1445 enters the guiding slot 129 from the opening 129a and slides in the guiding slot 129. As the first side frame 144 and the second side frame 146 move relative to the main frame 142 to the expansion positions, the telescopic fan cage 14 is at the installation state. At the moment, the telescopic fan cage 14 is substantially installed completely, as shown by FIG. 1 or FIG. 5. Therein, by the effect of structurally guiding and constraining each other of the guiding posts 1444, 1445 and 130 and the guiding slots 128, 129 and 1446, the telescopic fan cage 14 can extend in the casing 12 more steadily.

When the telescopic fan cage 14 is required to be detached from the casing 12, it is practicable to pull up the manipulation part 148 (i.e. move away relative to the main frame 142) to drive the first side frame 144 and the second side frame 146 through the first linkage part 150 and the second linkage part 152 respectively to slide toward the main frame 142, so that the guiding posts 1444 and 130 move to the openings 128a and 1446a and the guiding post 1445 departs from the guiding slot 129 through the opening 129a. At the moment, the telescopic fan cage 14 is at the transit state. Afterward, the telescopic fan cage 14 can be entirely pulled up along the installation direction Di (e.g. the user uses his hand to grip the handle portion 1484) until departing from the casing 12 completely. At the moment, the detachment of the telescopic fan cage 14 is completed. Therefore, the operation of installing the telescopic fan cage 14 in casing 12 and detaching the telescopic fan cage 14 from the casing 12 can be substantially implemented by the user using one single hand.

Furthermore, after the telescopic fan cage 14 is installed in the casing 12, the structural constraint between the guiding posts 1444, 1445 and 130 and the guiding slots 128, 129 and 1446 is also conducive to the fixing of the telescopic fan cage 14 in the casing 12. In the embodiment, after the telescopic fan cage 14 is installed in the casing 12, the guiding posts 1444, 1445 and 130 abut against ends of the guiding slots 128, 129 and 1446 respectively. Such structural configuration is also conducive to the fixing of the telescopic fan cage 14 in the casing 12. Furthermore, in practice, the guiding posts 1444, 1445 and 130 and the guiding slots 128, 129 and 1446 can be exchanged to dispose. Such structural configuration still can perform the above effect of structurally guiding and constraining each other. In addition, in the embodiment, the second side frame 146 and the casing 12 also have the structure like the guiding posts and the guiding slots, which also can perform the above effect of structurally guiding and constraining each other of the guiding posts and the guiding slots and will not be described in addition.

Figure 6:
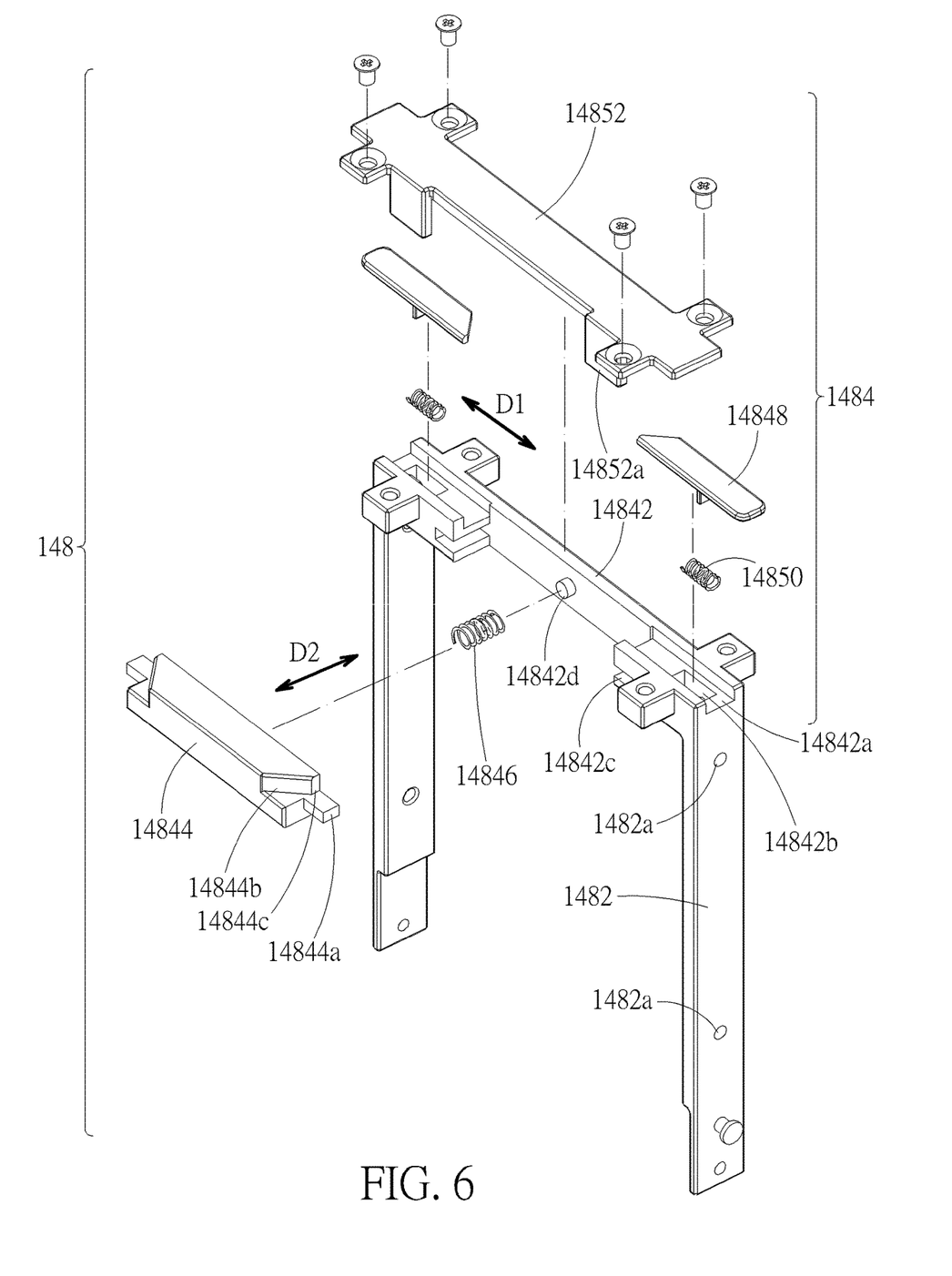
FIG. 6 is an exploded view of a manipulation part of the telescopic fan cage in FIG. 3.
Figure 7:
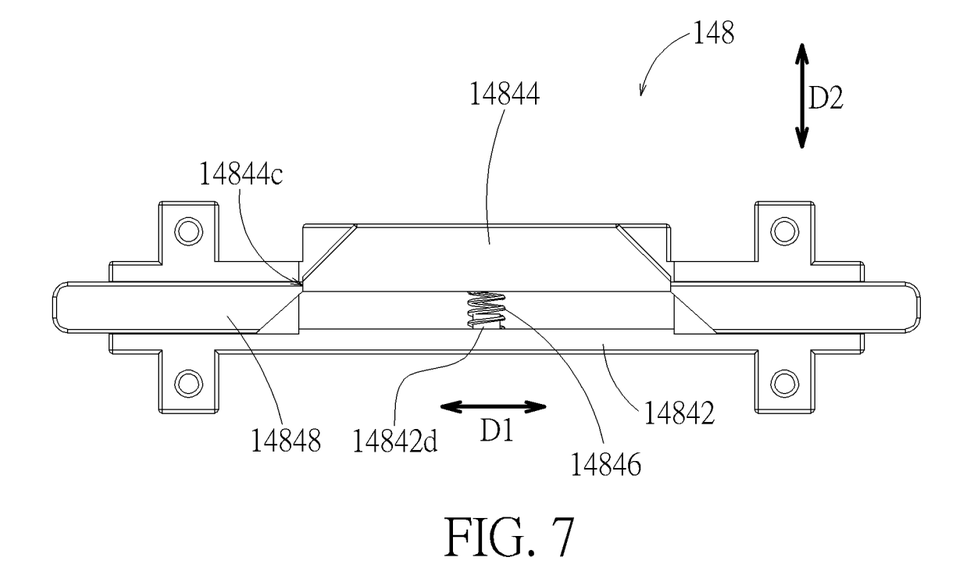
FIG. 7 is a top view of the manipulation part of the telescopic fan cage in FIG. 3; therein, a cover of the manipulation part is not shown.

Please refer to FIG. 3, FIG. 6 and FIG. 7. In the embodiment, the handle portion 1484 has a main portion 14842, a button 14844, a button restoration part 14846, a latch 14848, a latch restoration part 14850, and a cover 14852. The button 14844 is movably disposed on the main portion 14842. The button restoration part 14846 is connected to the main portion 14842 and the button 14844 to drive the button 14844 to protrude from the main portion 14842, so that the button 14844 can be pressed by the user easily. The latch 14848 is movably disposed on the main portion 14842. The latch restoration part 14850 is connected to the main portion 14842 and the latch 14848 to driver the latch 14848 to abut against the button 14844. The cover 14852 is fixed on the main portion 14842 and covers the button 14844, the button restoration part 14846, the latch 14848, and the latch restoration part 14850, which is conducive to the fixing of the components of the handle portion 1484 and to the action stability thereof. The button 14844 can be pressed to abut against and move the latch 14848. From another aspect, the button 14844 and the latch 14848 are kinetically linked, so the position of the latch 14848 relative to the main portion 14842 can be changed by manipulating the button 14844.

Figure 8:
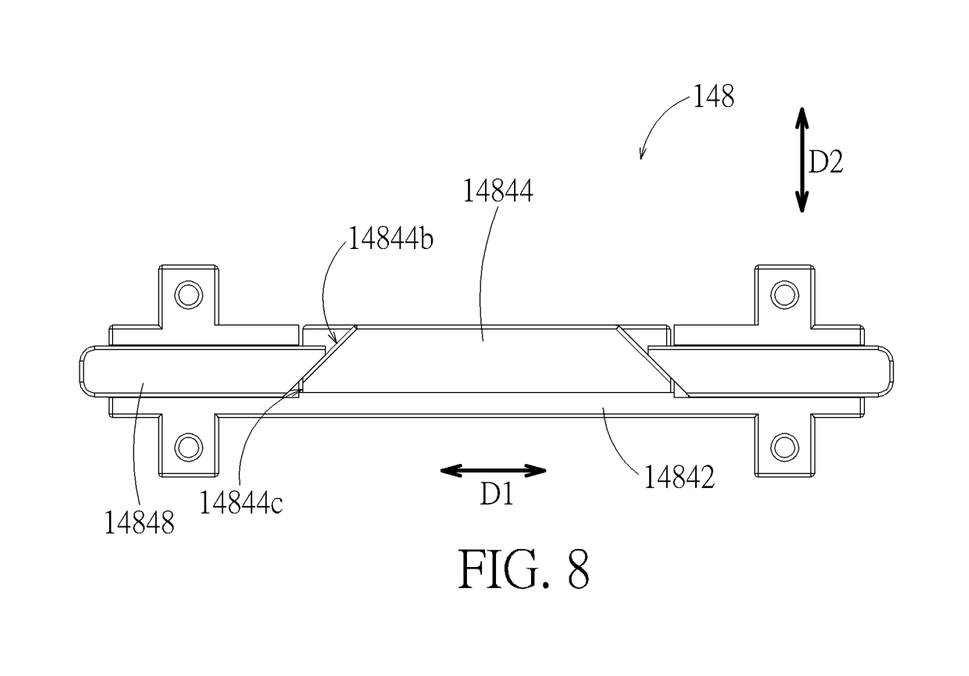
FIG. 8 is a top view of the manipulation part in FIG. 7 when a button thereof is pressed.

Please also refer to FIG. 8. In the embodiment, the latch 14848 is slidably disposed on the main portion 14842 (or the sliding slot 14842a thereof) along a first direction D1 (indicated by a double-head arrow in FIG. 7 and FIG. 8). The latch restoration part 14850 (e.g. but not limited to a spring) is compressed to be disposed in a recess 14842b of the main portion 14842. The latch restoration part 14850 drives the latch 14848 to retract back to the main portion 14842. The button 14844 is slidably disposed on the main portion 14842 (by slidably disposing protrusion tabs 14844a at sides of the button 14844 in sliding slots 14842c of the main portion 14842) along a second direction D2 (indicated by a double-head arrow in FIG. 7 and FIG. 8). The button restoration part 14846 (e.g. but not limited to a spring) is compressed to be disposed between the main portion 14842 and the button 14844 (therein, an end of the spring is sleeved on a post 14842d of the main portion 14842). The button 14844 has an oblique surface 14844b. The oblique surface 14844b (e.g. but not limited to a flat surface) extends along a direction slanting to the first direction D1 and the second direction D2 (i.e. the normal direction of the oblique surface 14844b is not perpendicular or parallel to the first direction D1 and the second direction D2). The button 14844 slides on the oblique surface 14844b through the latch 14848 so as to move the latch 14848.

Therein, as shown by FIG. 7, when the button 14844 is not pressed yet, under the resilient effect of the button restoration part 14846, the button 14844 keeps protruding from the main portion 14842 so as to be at a non-pressed position, and the button 14844 pushes the latch 14848 to protrude from the main portion 14842. At the moment, under the resilient effect of the latch restoration part 14850, the latch 14848 keeps abutting against the button 14844. Furthermore, in the embodiment, the button 14844 further has a flat surface 14844c. The flat surface 14844c is perpendicular to the first direction D1 and adjoins the oblique surface 14844b. When the button 14844 is at the non-pressed position, the latch 14848 abuts against the flat surface 14844c, which is conducive to keeping the latch 14848 protruding from the main portion 14842. During the process of pressing the button 14844, the button 14844 will slide toward the interior of the main portion 14842 so that the flat surface 14844c departs from the latch 14848 to make the latch 14848 slide toward the interior of the main portion 14842 on the oblique surface 14844b under the resilient effect of the latch restoration part 14850. As shown by FIG. 8, when the button 14844 slides toward the interior of the main portion 14842 to a pressed position, the latch 14848 has obviously retracted back to the main portion 14842.

In addition, in the embodiment, the cover 14852 has a blocking portion 14852a. The blocking portion 14852a is located at the outside of the protrusion tab 14844a of the button 14844 in the second direction D2 for blocking the button 14844 from departing from the main portion 14842. Furthermore, in the embodiment, the linkage between the button 14844 and the latch 14848 is achieved mainly by keeping the latch 14848 abutting against the oblique surface 14844b of the button 14844; however, it is not limited thereto in practice. For example, a slanting guiding slot (slanting to the first direction D1 and the second direction D2) is disposed on the button 14844, and a sliding block is disposed on the latch 14848. The sliding block is slidably disposed in the slanting guiding slot, so that the latch 14848 slides along the first direction D1 as the button 14844 slides along the second direction D2. For another example, the linkage between the button 14844 and the latch 14848 can be achieved by a mechanism like the linkage between the sliding portion 1482, the first linkage part 150, and the first side frame 144 or the variants thereof. Similarly, in practice, the linkage between the sliding portion 1482 and the first side frame 144 can be achieved by a mechanism like the linkage between the button 14844 and the latch 14848 or the variants thereof, which will not be described in addition.

Figure 9:
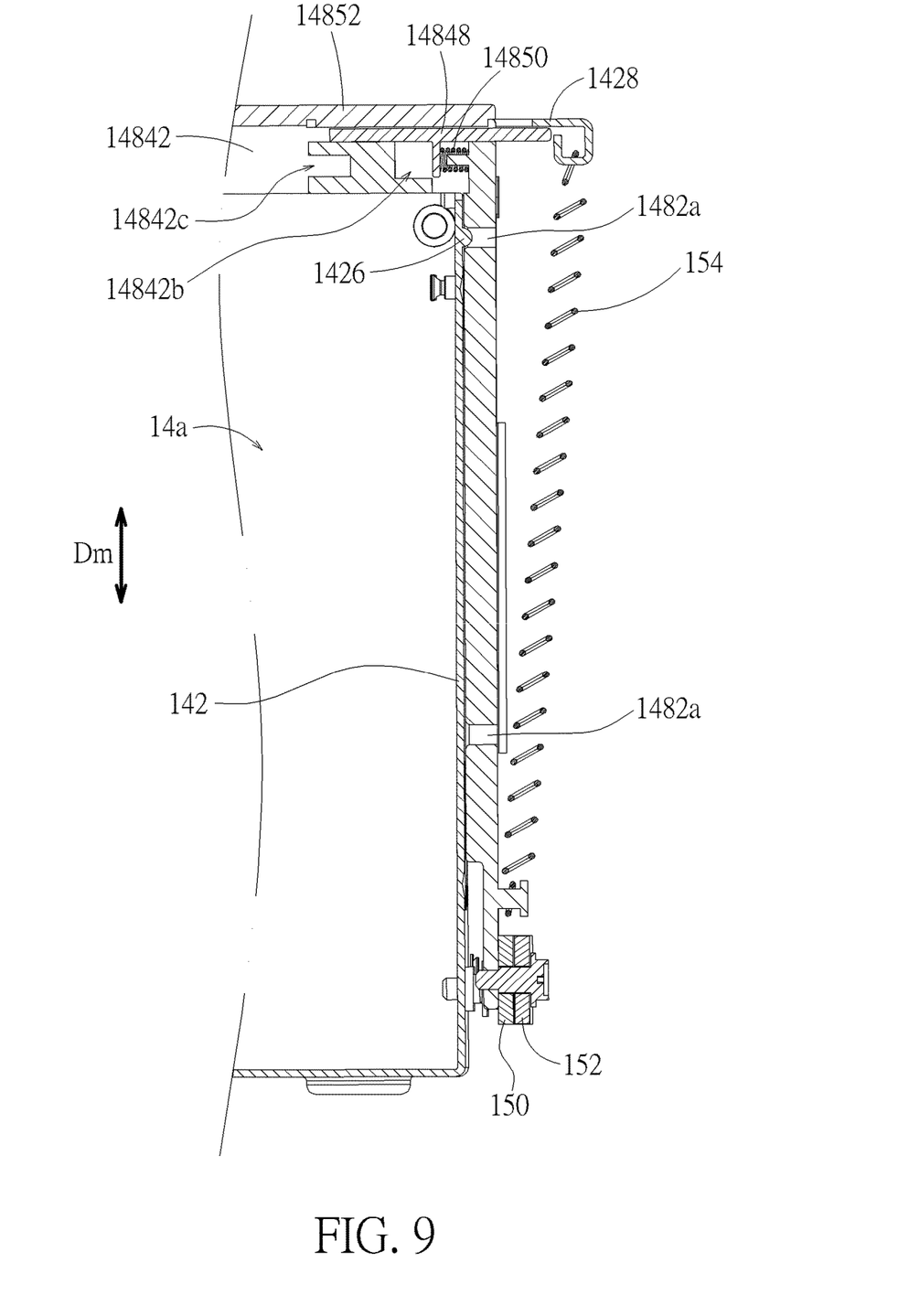
FIG. 9 is a sectional view of the telescopic fan cage in along the line X-X in FIG. 5.
Figure 10:
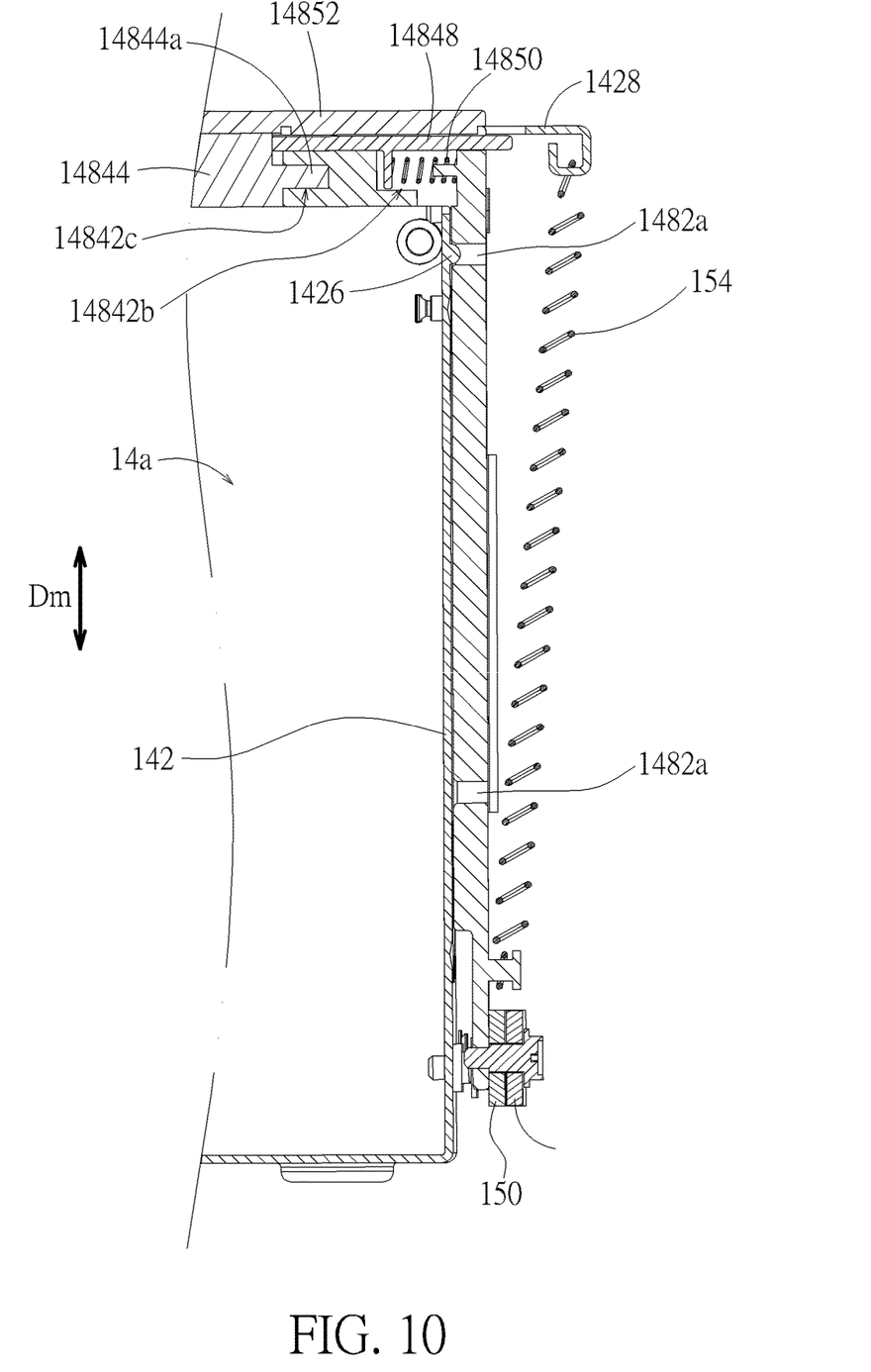
FIG. 10 is a sectional view of the telescopic fan cage in FIG. 9 when a latch of the manipulation part is retracted.

Please refer to FIG. 1, FIG. 3 and FIG. 9. The main frame 142 has a blocking structure 1428 corresponding to the latch 14848. When the telescopic fan cage 14 is at the installation state (i.e. the first side frame 144 and the second side frame 146 are located at the expansion positions), the blocking structure 1428 blocks the latch 14848 for preventing the manipulation part 148 from sliding away relative to the main frame 142 along the manipulation direction Dm. Furthermore, at the moment, the latch 14848 abuts against the flat surface 14844c. Therefore, the latch 14848 can structurally interfere with the blocking structure 1428 for preventing the manipulation part 148 from moving upward, which is convenient for the telescopic fan cage 14 to maintain at the installation state (as shown by FIG. 1). In practice, the interference structure between the latch 14848 and the blocking structure 1428 can be realized by other interference structures and is not limited to the embodiment. For example, the blocking structure 1428 can be replaced with an insertion slot structure (e.g. a hole structure). Furthermore, please refer to FIG. 8 and FIG. 10. When the button 14844 is pressed to make the latch 14848 retract back to the main portion 14842, the latch 14848 and the blocking structure 1428 will not structurally interfere with each other, so that the manipulation part 148 can slide upward relative to the main frame 142 so as to make the telescopic fan cage 14 at the transit state.

Furthermore, in the embodiment, the telescopic fan cage 14 further includes an elastic part 154 (e.g. but not limited to a spring, which is shown in a bold polyline in FIG. 1, FIG. 2 and FIG. 5) connected to the manipulation part 148 and the main frame 142. The elastic part 154 can apply force (i.e. resilient force) to the manipulation part 148 to drive the manipulation part 148 to slide away relative to the main frame 142. Thereby, when the latch 14848 retracts back to the main portion 14842, under the effect of the resilient force by the elastic part 154, the manipulation part 148 can move upward by a small distance automatically, which is convenient for the user to grip the handle portion 1484 and pull the manipulation part 148 so as to carry the telescopic fan cage 14 out of the casing 12.

Figure 11:
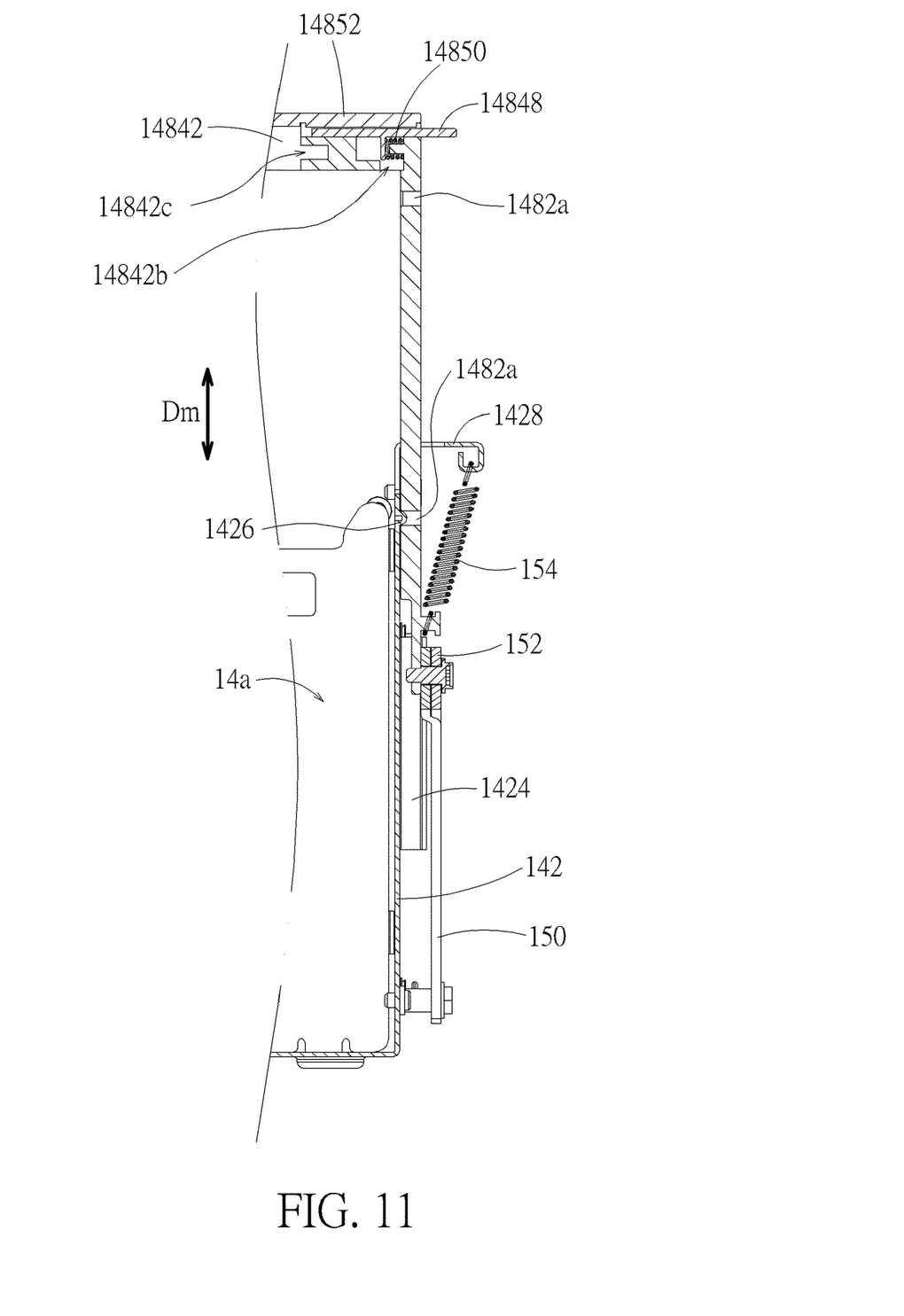
FIG. 11 is a sectional view of the telescopic fan cage in FIG. 9 when at the transit state.

Please refer to FIG. 3, FIG. 6, FIG. 9 and FIG. 11. Furthermore, in the embodiment, the sliding portion 1482 has a positioning structure 1482*a*. The main frame 142 has a corresponding positioning structure 1426. The positioning structure 1482*a* and the corresponding positioning structure 1426 are selectively engaged with each other to position the sliding portion 1482 to at least one position. Therein, the positioning structure 1482*a* is realized by two recesses (e.g. but not limited to through holes), while the corresponding positioning structure 1426 is realized by a protrusion (e.g. but not limited to a hemisphere protrusion). The protrusion can selectively fit in one of the two recesses. As shown by FIG. 9, when the telescopic fan cage 14 is at the installation state, the blocking structure 1428 blocks the latch 14848, and the positioning structure 1426 fits in the upper recess of the positioning structure 1482*a* (i.e. at the upper portion of the sliding portion 1482), so that the sliding portion 1482 is positioned in one of the positions. As shown by FIG. 11, when the telescopic fan cage 14 is at the transit state, the manipulation part 148 is moved upward, and the positioning structure 1426 fits in the lower recess of the positioning structure 1482*a* (i.e. at the lower portion of the sliding portion 1482), so that the sliding portion 1482 is positioned in the other positions. Therefore, the positioning effect between the positioning structure 1482*a* and the positioning structure 1426 can produce feedback to the user for convenience of the user manipulating the manipulation part 148.

Furthermore, in practice, a required quantity of the positioning positions for the sliding portion 1482 is not limited to two. For example, the positioning structure 1482*a* has only the lower recess, so that when pulling the manipulation part 148, the user still can feel whether the telescopic fan cage 14 is at the transit state. For another example, the positioning structure 1482*a* further includes another recess between the above two recess. When the manipulation part 148 slides upward automatically under the resilient effect of the elastic part 154, the positioning structure 1426 can fit in this recess so that the handle portion 1484 can maintain a proper interval from the main frame 142, which is convenient for the user to grip the handle portion 1484. Furthermore, in practice, the positioning structure 1482*a* can be replaced with a protrusion (e.g. but not limited to a hemisphere protrusion), while the corresponding positioning structure 1426 is replaced with two recesses (e.g. but not limited to through holes). Such structural configuration also can perform the positioning effect to the sliding portion 1482 (or the manipulation part 148).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A telescopic fan cage, comprising:
   a main frame;
   a first side frame, the first side frame and the main frame being slidably connected with each other along a sliding direction to form a fan installation space, the first side frame being operable to slide toward the main frame to shrink the fan installation space, the first side frame being operable to slide away relative to the main frame to expand the fan installation space; and
   a first linkage part, the first linkage part being connected to the first side frame and being slidably connected to the main frame along a manipulation direction, the manipulation direction and the sliding direction being non-parallel.

2. The telescopic fan cage according to claim 1, wherein one of the main frame and the first side frame comprises a sliding slot, the other one of the main frame and the first side frame comprises a sliding block, and the first side frame and the main frame are slidably connected by slidably disposing the sliding block in the sliding slot.

3. The telescopic fan cage according to claim 1, further comprising a manipulation part and, wherein the manipulation part is slidably disposed on the main frame, the first linkage part is connected to the manipulation part, and the manipulation part is operable to drive the first side frame to move relative to the main frame through the first linkage part.

4. The telescopic fan cage according to claim 3, wherein the manipulation part is operable to slide away relative to the main frame to drive the first side frame through the first linkage part to slide toward the main frame, and the manipulation part is operable to slide toward the main frame to drive the first side frame through the first linkage part to slide away relative to the main frame.

5. The telescopic fan cage according to claim 3, wherein the first linkage part is a link and is pivotally connected to the manipulation part and the first side frame.

6. The telescopic fan cage according to claim 3, further comprising a second side frame and a second linkage part, wherein the second side frame and the main frame are slidably connected, the main frame, the first side frame, and the second side frame together form the fan installation space, the second side frame slides toward the main frame to shrink the fan installation space, the second side frame slides away relative to the main frame to expand the fan installation space, the second linkage part is connected to the manipulation part and the second side frame, and the manipulation part is operable to drive the second side frame to move relative to the main frame through the second linkage part.

7. The telescopic fan cage according to claim 6, wherein the manipulation part is operable to slide away relative to the main frame to drive the first side frame and the second side frame through the first linkage part and the second linkage part respectively to slide toward the main frame, and the manipulation part is operable to slide toward the main frame to drive the first side frame and the second side frame through the first linkage part and the second linkage part respectively to slide away relative to the main frame.

8. The telescopic fan cage according to claim 3, wherein the first side frame slides away relative to the main frame to an expansion position for expanding the fan installation space, the manipulation part comprises a latch, the main frame has a blocking structure, and when the first side frame is at the expansion position, the blocking structure blocks the latch so as to prevent the manipulation part from sliding away relative to the main frame.

9. The telescopic fan cage according to claim 8, further comprising an elastic part, wherein the elastic part is connected to the manipulation part and the main frame, and the elastic part applies force to the manipulation part so as to drive the manipulation part to move away relative to the main frame.

10. The telescopic fan cage according to claim 8, wherein the manipulation part comprises a sliding portion, the sliding portion is slidably disposed on the main frame, the sliding portion has a positioning structure, the main frame has a corresponding positioning structure, and the positioning structure and the corresponding positioning structure are selectively engaged with each other to position the sliding portion to at least one position.

11. The telescopic fan cage according to claim 8, wherein the manipulation part comprises a sliding portion and a handle portion, the sliding portion is slidably disposed on the main frame, the handle portion is connected to the sliding portion, the handle portion comprises a main portion, a button, and a button restoration part, the button is movably disposed on the main portion, the button restoration part is connected to the main portion and the button to drive the button to protrude from the main portion, the latch is movably disposed on the main portion, and the button is operable to be pressed to abut against and move the latch.

12. The telescopic fan cage according to claim 11, wherein the latch is slidably disposed on the main portion along a first direction, the button is slidably disposed on the main portion along a second direction, the first direction is perpendicular to the second direction, the button has an oblique surface, the oblique surface extends slanting to the first direction and the second direction, and the button moves the latch by sliding the latch on the oblique surface.

13. The telescopic fan cage according to claim 12, wherein the button has a flat surface, the flat surface is perpendicular to the first direction and adjoins the oblique surface, and when the first side frame is at the expansion position, the latch abuts against the flat surface.

14. The telescopic fan cage according to claim 11, wherein the handle portion comprises a latch restoration part, the button restoration part is connected to the main portion and the latch to drive the latch to abut against the button.

15. The telescopic fan cage according to claim 14, wherein the handle portion comprises a cover, and the cover is fixed on the main portion and covers the button, the button restoration part, the latch, and the latch restoration part.

16. The telescopic fan cage according to claim 15, wherein the cover has a blocking portion, and the blocking portion blocks the button from departing from the main portion.

17. An apparatus case, comprising:
a casing; and
a telescopic fan cage, the telescopic fan cage being detachably disposed in the casing and comprising:
a main frame; and
a first side frame, the first side frame and the main frame being slidably connected with each other to form a fan installation space;
wherein the first side frame is operable to slide toward the main frame to shrink the fan installation space, so that the telescopic fan cage is at a transit state for being moved in or out the casing; and
wherein the first side frame is operable to slide away relative to the main frame to expand the fan installation space, so that the telescopic fan cage is at an installation state for being fixed to the casing.

18. The apparatus case according to claim 17, wherein the casing comprising two opposite side walls and a structure between the two opposite side walls, the two opposite side wall form a cage accommodating space therebetween, the telescopic fan cage is moved in or out the cage accommodating space along an installation direction, and the structure is above the cage accommodating space in the installation direction.

19. The apparatus case according to claim 17, wherein the first side frame is slidably connected to the main frame along a sliding direction, one of the first side frame and the casing comprises a guiding post, the other one of the first side frame and the casing comprises a guiding slot, the guiding slot extends parallel to the sliding direction, and during the first side frame sliding relative to the main frame along the sliding direction, the guiding post slides in the guiding slot.

20. The apparatus case according to claim 19, wherein the telescopic fan cage is moved in or out the casing along an installation direction, the guiding slot has a guiding opening, and during the telescopic fan cage moving in the casing along the installation direction, the guiding post enters the guiding slot from the guiding opening.

* * * * *